United States Patent [19]

Horvath et al.

[11] Patent Number: 4,716,487

[45] Date of Patent: Dec. 29, 1987

[54] APPARATUS FOR MONITORING MOTOR WINDING LEAKAGE

[75] Inventors: Joseph G. Horvath, Astatula; James C. Miller, Tavares, both of Fla.

[73] Assignee: Automeg, Inc., Astatula, Fla.

[21] Appl. No.: 859,365

[22] Filed: May 5, 1986

[51] Int. Cl.⁴ .............................................. H02H 3/16
[52] U.S. Cl. ....................................... 361/42; 318/490
[58] Field of Search ....................... 324/309, 510, 511; 318/490; 361/42-50; 340/647, 648, 650

[56] References Cited

U.S. PATENT DOCUMENTS

| | | | |
|---|---|---|---|
| 3,764,855 | 10/1973 | Beachley | 361/47 |
| 3,947,759 | 3/1976 | Briggs | 361/49 X |
| 4,011,483 | 3/1977 | Meadows | 361/47 |
| 4,133,017 | 1/1979 | Johnson et al. | 361/42 |
| 4,159,501 | 6/1979 | White | 361/47 |
| 4,540,922 | 10/1985 | Horvath et al. | 340/657 X |

Primary Examiner—Roy N. Envall, Jr.
Assistant Examiner—Jeffrey A. Geffin
Attorney, Agent, or Firm—MacDonald J. Wiggins

[57] ABSTRACT

A system for automatically monitoring the insulation leakage resistance of an electric motor for a short period prior to operation thereof having timing means for delaying application of the motor control voltage to the motor and for applying a high voltage direct current to the windings of the motor during such period. A sense resistor is connected between the motor frame and the high voltage supply ground, and the leakage current therethrough is monitored by a comparator. When the leakage current exceeds a preselected threshold, an alarm is initiated and operation of the motor is inhibited.

7 Claims, 2 Drawing Figures

APPARATUS FOR MONITORING MOTOR WINDING LEAKAGE

BACKGROUND OF THE INVENTION

1. Field of the Invention

The present invention relates to apparatus for measuring insulation leakage in motors and, more particularly, to apparatus for monitoring the windings of an in-service electrical pump motor and the like for leakage and for inhibiting operation of the motor when excessive leakage is indicated.

2. Description of the Prior Art

In electrical systems which utilize electric motors, the insulation of the motor windings can deteriorate, causing leakage of current to ground. High leakage currents can cause damage to the motor windings requiring replacement or rebuilding of the motors. In particular, systems utilizing submerged pump motors, such as lift stations, wells and other water systems, are particularly susceptible to insulation damage and leakage. In a submerged motor, it is common to utilize double shaft seals to prevent water or moisture from getting into and coming in contact with the motor windings. Under normal use, these seals may deteriorate permitting a resultant leakage of water. If the problem is caught in a timely fashion, the motor may be removed, disassembled and baked out to remove moisture which may have infiltrated the windings. The seals may be replaced, and the motor may be reassembled and placed back in service. The cost for such repairs is minimal compared to the cost if the deterioration were allowed to continue to the point of complete failure of the motor windings.

To forestall serious difficulties, a usual practice is to periodically test the insulation resistance from the windings to neutral or the ground connection to the motor frame. This is done with a megger, which may be a hand cranked magneto device that places several hundred volts between the winding and the motor frame and measures any leakage currents. If the leakage exceeds a predetermined value, it is an indication that there is an incipient seal failure. This manual approach to testing is time consuming where numerous pumps and motors are in use. In many instances, such testing may be done so infrequently that failure can occur before scheduled testing.

There is a need for apparatus which can provide continuous monitoring of leakage resistances in motors so that potential problems may be recognized long before serious damage is done. One approach to this need is disclosed in U.S. Pat. No. 4,159,501 to White, which teaches the use of a high voltage direct current power source connected to an electrical motor to be monitored. The apparatus provides an output indication in response to a first leakage resistance and another indication responsive to a second leakage resistance, producing a signal warning in response to the second resistance value. In addition, an interrupter is provided to remove primary power from the load when leakage is detected. A disadvantage of the White apparatus is that the direct current high voltage supply, which may be 500 volts or so, is connected to the power line at all times even while the motor is in operation. Thus, not only will the leakage resistance of the motor to ground be measured, but also that of every other load, such as other motors and other electrical devices on the same circuit. In addition, the high voltage is added to the ac voltage present which will cause very large peaks of high voltage which can result in arcing and/or damage to insulation.

A monitoring device for motor winding insulation resistance is disclosed in Japanese Patent No. 84,370 to Teraguchi. Teraguchi shows a field winding having a dc power supply connected to the motor, a leak detector, an indicator, and a switch, but has no means disclosed for automatically monitoring the leakage resistance. U.S. Pat. No. 4,540,922 issued to the present inventors and assigned to Automeg, Inc. discloses an apparatus for automatically monitoring motor winding leakage in dual motor installations.

There exists a need for a simple low cost insulation resistance monitor for a single motor and the like which will be automatically connected to the motor windings only when the motor is not in operation which will give a positive indication when leakage resistance becomes excessive and, in such instance, inhibit operation of the motor.

SUMMARY OF THE INVENTION

The present invention will be described with reference to a three-phase motor which is being intermittently energized by a motor controller.

The invention includes a low voltage power supply, a high impedance high voltage power supply, an adjustable timer switch, and a comparator. The negative terminals of the low voltage and high voltage power supplies are connected to a common point, hereinafter referred to as the system ground. A voltage in the range of 500 to 800 volts is produced by the high voltage supply which is selectively connected to one phase of the motor on the motor side of the controller contacts for a selected time interval at the time the motor contactor control is supplied a start signal. The timer serves to selectively connect the high voltage lead from the high voltage supply to the motor winding.

It is desired to monitor the leakage resistance of the motor only when it is non-operative. Operation of the timer is effected by connections to the motor control which supplies power to the motor contactor winding.

A lead is connected from the motor ground connection of the motor, represented by the motor frame, and is connected through a sensing resistor to the system ground, which floats with respect to the motor ground. If there is leakage between the motor windings and the motor frame, a dc leakage current produced by the high voltage monitoring voltage will flow through the motor ground connection and the sensing resistor back to the high voltage supply producing a voltage drop thereacross proportional to the leakage.

In accordance with the invention, a comparator circuit is connected across the sensing resistor. The comparator circuit includes a variable reference voltage input for providing a threshold level which is adjusted in accordance with the value of leakage resistance to be indicated. For example, if it is desired to indicate when a leakage resistance of 1 megohm is found, the voltage produced across the sensing resistor due to a 1 megohm leakage is determined. The comparator is then adjusted to have a reference voltage slightly higher than the 1 megohm reference voltage. When such leakage voltage appears at the comparator input, the comparator will trigger, closing a relay and may also energize a visual signal which may be, for example, a light emitting diode (LED), an audible alarm, or other type of alarm. The relay is interlocked with the motor contactor to prevent operation of the motor when excessive leakage is present. Thus, the invention permits gradual deterioration in a motor to be detected to inhibit the motor operation, and to provide an audible alarm or the like before severe damage can occur.

Advantageously, the monitoring circuit is connected to the windings of the motor only when the motor is completely disconnected from the power lines.

It is therefore a principal object of the invention to provide a leakage resistance monitoring system especially adapted for a submerged pump motor and the like which may produce visual and audible alarms when a preselected low leakage resistance occurs, and which will prevent application of power to the motor.

It is another object of the invention to provide an electrical leakage resistance monitoring system which will be connected to the device to be monitored just before the device is energized.

It is yet another object of the invention to provide an electrical leakage resistance monitoring system having a timer for selectively connecting and disconnecting a dc high voltage to the motor winding or other apparatus to be tested for a preselected time period immediately before operation thereof.

It is a further object of the invention to provide an electrical leakage monitoring system having an indicator which will indicate deterioration in the insulation of an electric motor.

It is still a further object of the invention to provide a leakage resistance monitoring system which will produce an audible alarm when the leakage resistance has decreased to an unacceptable value and means for prevention of operation of the device.

These and other objects and advantages of the invention will become apparent from the following detailed description and the drawings.

DETAILED DESCRIPTION OF THE PREFERRED EMBODIMENT

Figure 1:
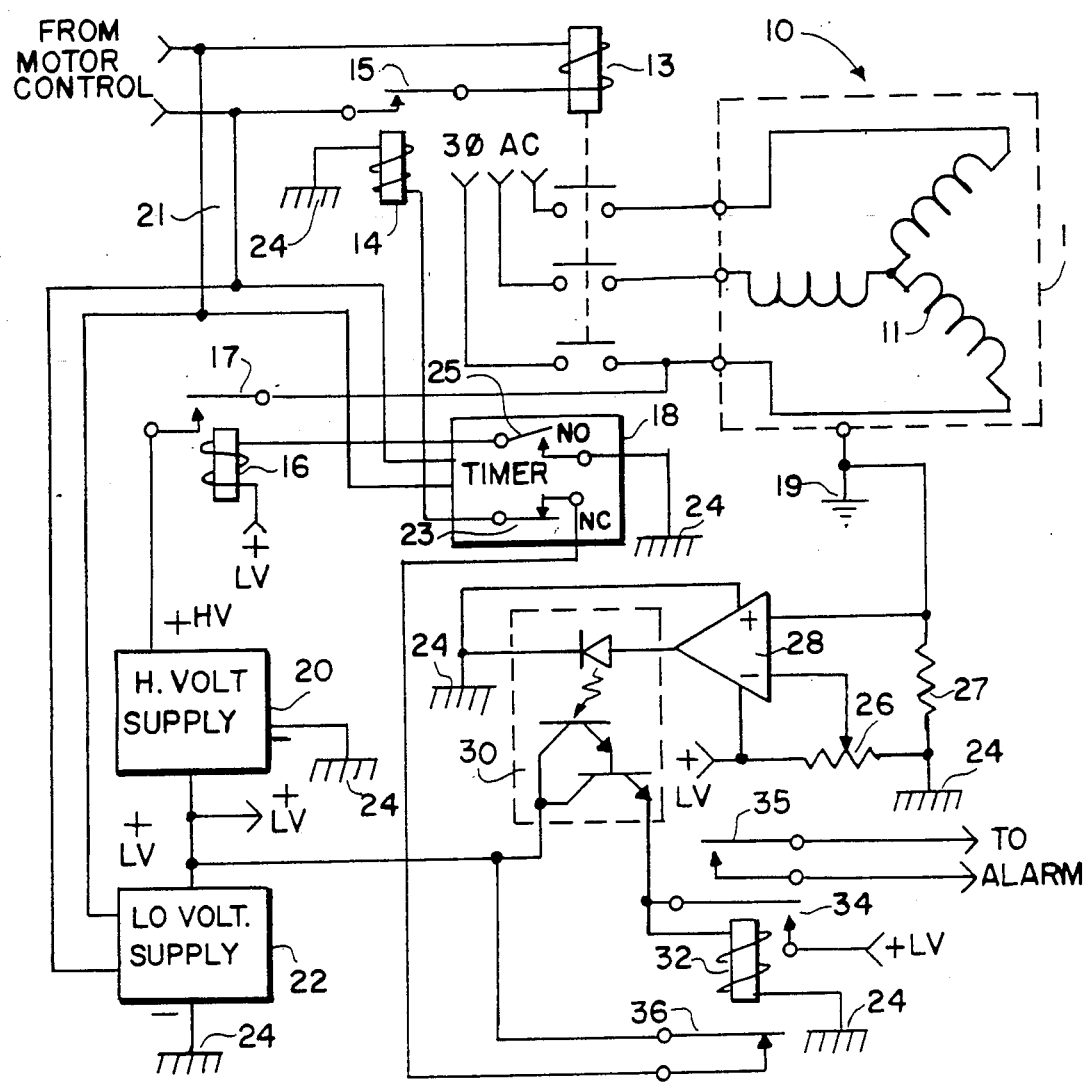
FIG. 1 is a schematic diagram of an embodiment of the invention as applied to a typical three-phase motor.

Referring to FIG. 1, a schematic diagram of the preferred embodiment of the invention is shown. A motor 10 to be monitored is shown having a three-phase winding 11 and controlled by a contactor 13. The frame of the motor 10 is shown by dashed line box 12 which is considered to be grounded as indicated by the ground symbol 19.

Motor 10 is controlled from an external control not shown which may be an automatic device such as a float control. The motor control is assumed to apply an operating voltage to contactor 13 via normally open contacts 15 of relay 14. As will be apparent, relay 14 must be operated to permit contactor 13 to close. The motor control also applies power to low voltage supply 24 and timer 18 as discussed hereinafter.

The motor winding leakage monitor of the invention includes a low voltage power supply 22 which may be operated from the ac power line and preferably produces an output voltage of approximately 12 volts. A system ground 24 is connected to the negative terminal of low voltage supply 22 as indicated by the alternative ground symbol. It is to be understood that ground 24 is floating with respect to ground 19 of motor frame 12. As indicated, low voltage supply 22 provides power to the various electronic components of the invention. Low voltage supply 22 also powers a high impedance high voltage supply 20 which has its negative terminal connected to the system ground 24. The positive terminal of high voltage supply 20 may supply any desired high voltage in the neighborhood of 500–800 volts. Due to the high impedance of high voltage supply 20, any appreciable load thereon will greatly reduce the voltage as a safety measure.

Power supplies 22 and 20 may utilize the circuits shown in U.S. Pat. No. 4,540,922, or any of other circuits known to those skilled in the art.

Normally-open contact 17 of relay 16, when closed, will apply high voltage to a winding 11 of motor 10. It will be noted that the motor ground 19 is connected to the system ground 24 through a sensing resistor 27. As will be understood, when relay contacts 17 are closed, any leakage between windings 11 and frame 12 of motor 10 will result in a current flow through resistor 27 and therefore will produce a voltage drop thereacross. A comparator 28 is connected across sensing resistor 24 with a threshold control 26 connected to the negative input of comparator 28. This permits any desired leakage threshold to be set. For example, if an indication is desired when the leakage resistance is about 1 megohm, potentiometer 26 is adjusted such that the voltage drop across sensing resistor 27 when the leakage between winding 11 and frame 12 is about 1 megohm will just exceed the positive voltage applied to the negative input of comparator 28. Comparator 28 will at that point produce a high at its output.

The output of comparator 28 is connected via the input of an optoisolator 30 to the system ground. Thus, when comparator 28 produces a HIGH at its output, the output leads of optoisolator 30 will be conducting.

Referring again to relay 14, it may be noted that under normal conditions, relay 14 is connected via normally-closed contacts 23 in timer 18 and normally closed contacts 36 of relay 32 to the 12 volt supply. This causes relay 14 to be normally operated and contacts 15 to be closed when low voltage power supply 12 is energized. Therefore, when a control signal is present on the leads to contactor 13 and timer 18 is in the state shown, contactor 13 will operate, energizing motor 10. However, when comparator 28 is tripped, relay 32 will operate opening contacts 36 causing contacts 15 to open placing the contactor 30 is an inoperative condition. When relay 32 operates, contacts 34 also close which will lock up relay 32 until manually released or reset. Contacts 35 may be connected to an external alarm circuit not shown.

Timer 18 may be any type of known timer which is adjustable over a range of 10–30 seconds. Timer 18 includes a set of normally-open contacts 25 and a set of normally-closed contacts 23. The normally-open contacts are connected to high voltage relay 16 to control contact 17 for application of the high test voltage to the windings of motor 10. It will be noted that operation of timer 18 will cause the normally-closed contacts 23 to open and the normally-open contacts 25 to close. Therefore, it is not possible for high voltage to be applied to motor 10 when timer 18 is operated.

Figure 2:
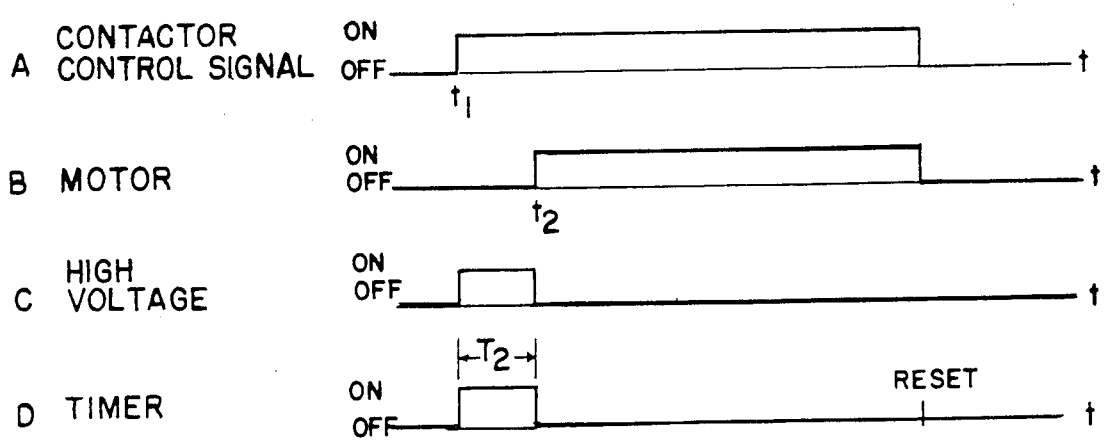
FIG. 2 is a timing diagram of a run cycle of a motor using the invention.

The operation of the motor leakage winding monitor of the invention is best explained with the assistance of the diagram of FIG. 2 in which the condition of the various elements of FIG. 1 are indicated as a function of time. Line A indicates that when the contactor control signal is OFF, the timer is OFF or non-operated, low voltage supply 22 is not operating, the high voltage is not connected to the motor winding, and the motor is not operating. Assume that the motor control applies power to the contactor circuit at time $t_1$, indicated by the contactor control signal being ON. As will be noted also from FIG. 1, the power from the motor control circuit is also applied to low voltage supply 22 and to timer 18 causing the normally-closed contacts 23 to open and the normally-open contacts 25 to close. Line D indicates that the timer will be ON at this point. The timer will time-out after a preselected time period $t_2$ and will remain OFF until reset by the absence of an operating voltage on leads 21. During the period $t_2$, the normally-open contacts 25 of timer 18 are closed operating relay 16. This applies the high voltage via contacts 17 to windings 11 of motor 10. At the same time, the normally-closed contacts 23 of timer 18 are open, disabling relay 14 causing contacts 15 to open. This action inhibits contactor 13 from closing. As indicated in Line C of FIG. 2, the high voltage is on with respect to motor 10 for the period $t_2$. When timer 18 times-out, the normally-open contacts 25 open, releasing relay 16 and removing the high voltage from winding 11. Also at this time, the normally-closed contacts 23 of timer 18 close operating relay 14 and applying the motor control voltage to contactor 13 permitting the motor to operate for the required period as shown on the line B. When the motor is turned OFF by the absence of power from the motor control, timer 18 is reset, ready for another cycle of operation as shown on line D.

If, when the high voltage is applied to winding 11, excessive leakage is present such that the voltage across sensing resistor 27 causes comparator 28 to energize relay 32, contacts 34 will be closed locking that relay 32 up and normally-closed contacts 36 will be open preventing relay 14 from operating at the conclusion of the timing period $t_2$. Relay 32 contacts 35 will close causing an alarm to be actuated and the motor will be inhibited from running which could cause additional damage thereto.

As will now be recognized, a device has been described which will test a motor winding immediately prior to operation thereof to determine if the motor winding-to-frame leakage is excessive. If such leakage is within limits, the motor will then operate normally. However if the leakage is excessive, the device will automatically inhibit the operation of the motor and will produce an alarm to alert an operator of a problem to permit correction before further damage to the motor.

Although specific circuit and circuit elements have been described, it is to be understood that these are for exemplary purposes only and those of skill in the art will note various alternative devices and elements that can be substituted therefore and which will fall within the spirit and scope of the invention.

I claim:

1. In an electric motor having an electrical winding, controlled by a contactor and having a source of control voltage for operating said contactor, a system for automatically monitoring the insulation leakage resistance of said electric motor winding prior to each operation of said motor comprising:

power supply means for supplying a source of high-voltage direct current and having a system ground;

timing means connected to said power supply means and to said source of control voltage, said timing means being responsive to said control voltage to connect said high voltage to the electrical winding for a short period of time and to thereafter apply said control voltage to said contactor;

a sense resistor connected from a frame of said motor to said system ground; and comparator means connected across said sense resistor for producing an indication when a voltage across said resistor due to flow of leakage current exceeds a preselected value.

2. The apparatus as defined in claim 1 in which said comparator means includes an adjustable threshold voltage for adjusting said comparator means to produce an indication when a preselected voltage occurs across said resistor representative of a selected insulation leakage resistance valve.

3. The apparatus as defined in claim 2 in which said comparator means includes:

a first relay having first contacts thereof operatively connected to an alarm; and an optoisolator connected to the output of said comparator means and to said relay for causing said relay to operate when said comparator produces said indication.

4. The apparatus as defined in claim 3 in which said timing means includes:

a second relay having a first set of normally open contacts connected to interrupt said control voltage to said contactor during said short period of time; and a third relay having a second set of normally open contacts connected to apply said high voltage to said motor windings only during said short period of time.

5. In an electric motor having a contactor for control of said motor, an automatic insulation resistance tester for testing the insulation leakage resistance of windings of said motor immediately prior to each operation thereof comprising:

a first relay having normally open contacts connected between said contactor and a source of control voltage therefor;

a timer connected to said source of control voltage and having first contacts closed only during a timing period thereof and second contacts open only during said timing period, said second contacts connected to operate said first relay following said timing period, said timing period being initiated by said control voltage;

a high voltage source having a ground connection;

a second relay having normally open contacts connected between said high voltage source and said motor windings, said second relay operatively connected to said timer and operated thereby during said timing period;

a sense resistor connected between a frame of said motor and said ground connection;

a comparator connected across said sense resistor and having a threshold voltage adjustment; and an alarm connected to said comparator and operated when a voltage across said sense resistor occurs greater than a preselected threshold voltage representative of a selected value of insulation leakage resistance.

6. The apparatus as recited in claim 5 in which said comparator further includes a third relay having normally closed contacts, said relay being closed when said preselected threshold voltage is exceed, said normally closed contacts, when open, connected to open said first relay and thereby prevent operation of said motor.

7. The apparatus as recited in claim 6 in which said comparator further includes an optoisolator for controlling said alarm and said third relay.

* * * * *